US006430718B1

(12) United States Patent
Nayak

(10) Patent No.: US 6,430,718 B1
(45) Date of Patent: Aug. 6, 2002

(54) ARCHITECTURE, CIRCUITRY AND METHOD FOR TESTING ONE OR MORE INTEGRATED CIRCUITS AND/OR RECEIVING TEST INFORMATION THEREFROM

(75) Inventor: Anup K. Nayak, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/385,189

(22) Filed: Aug. 30, 1999

(51) Int. Cl.$^7$ ............................................. G01R 31/28
(52) U.S. Cl. .................................... 714/727; 714/729
(58) Field of Search .......................... 714/726, 727, 714/729, 731, 744; 326/16

(56) References Cited

U.S. PATENT DOCUMENTS

| | | | |
|---|---|---|---|
| 4,710,927 A | | 12/1987 | Miller |
| 4,995,039 A | * | 2/1991 | Sakashita et al. ............ 714/731 |
| 5,355,369 A | | 10/1994 | Greenberger et al. |
| 5,390,191 A | * | 2/1995 | Shiono et al. ................ 714/727 |
| 5,428,622 A | * | 6/1995 | Kuban et al. ................. 714/729 |
| 5,430,735 A | * | 7/1995 | Sauerwald et al. ........... 714/731 |
| 5,457,698 A | * | 10/1995 | Segawa et al. ............... 714/731 |
| 5,471,481 A | * | 11/1995 | Okumoto et al. ............. 714/727 |
| 5,543,730 A | | 8/1996 | Cliff et al. |
| 5,546,406 A | * | 8/1996 | Gillenwater et al. ......... 714/733 |
| 5,602,855 A | * | 2/1997 | Whetsel, Jr. ................. 714/727 |
| 5,657,329 A | * | 8/1997 | Sauerwald et al. ........... 714/726 |
| 5,742,617 A | | 4/1998 | Warren |
| 5,751,163 A | | 5/1998 | Tang et al. |
| 5,805,607 A | | 9/1998 | Khu |
| 6,199,182 B1 | * | 3/2001 | Whetsel ....................... 714/724 |

OTHER PUBLICATIONS

*IEEE Standard Test Access Port and Boundary–Scan Architecture*, Copyright 1993 by the Institute of Electrical and Electronics Engineers, Inc.

* cited by examiner

Primary Examiner—Albert Decady
Assistant Examiner—Joseph D. Torres
(74) Attorney, Agent, or Firm—Kevin L. Daffer; Conley, Rose & Tayon P.C.

(57) ABSTRACT

Architecture, circuitry, and methods are provided for testing one or more integrated circuits which may be arranged upon a printed circuit board. The integrated circuits include sequential and combinatorial logic used by the integrated circuit during normal functioning thereof. Testing of that logic can occur by sending test vectors in parallel or serial form to input pins of the integrated circuit. The test results can either be read as a serial data stream or as a parallel-delivered data stream. If the test information and results occur in parallel fashion, than automated test equipment can be used which do not require compliance with having a single serial fed test vector input and test result output, normally found in a TAP application. A parallel/serial multiplexer is used to select whether the integrated circuit receives parallel or serial test vectors, and another parallel/serial multiplexer is used to select whether the test results are to be delivered in parallel or serial fashion. A test access port controller is linked to various boundary scan cells, and control signal generators within the controller orchestrate movement of test data or normal functional data into and from the integrated circuit core logic. Parallel fed test vectors can be shifted from the input cells as serial fed test vectors and then back to the input cells, where the test vectors can then be sent to the core logic among numerous conductors in parallel fashion. Likewise, the test results can be converted from a parallel to serial form and fed back to the output cells, whereupon the test results can be sent to the test equipment as parallel-delivered test results.

23 Claims, 4 Drawing Sheets

ARCHITECTURE, CIRCUITRY AND METHOD FOR TESTING ONE OR MORE INTEGRATED CIRCUITS AND/OR RECEIVING TEST INFORMATION THEREFROM

BACKGROUND OF THE INVENTION

1. Field of the Invention

This invention relates to an architecture, circuitry and method for testing one or more integrated circuits, each of which implements a test access port ("TAP") such as the JTAG access port described in IEEE Std 1149.1. The test circuitry can place test signals in parallel upon an integrated circuit, shift the test signals through boundary scan cells while using the serialized boundary scan architecture, and thereafter dispatch the test results in parallel from the integrated circuit.

2. Description of the Related Art

Testing an integrated circuit can be performed in various ways. For example, the integrated circuit can be tested while in wafer form using test probe operation. Additionally, or alternatively, the integrated circuit can be tested after it is scribed and packaged. In either instance, sequential and/or combinatorial logic of the integrated circuit must be tested using input test data, generally referred to as "test vectors." Test vectors are supplied from a commercial test machine or automated test equipment ("ATE"). Alternatively, the test vectors can be provided from circuitry upon the integrated circuit. Such circuitry is often referred to as built in self test ("BIST") circuitry. BIST circuitry may use a pseudo-random sequence generator to produce test vectors forwarded to the functional core logic of the integrated circuit.

BIST has been used successfully on a number of integrated circuits. However, BIST is difficult to use when testing arbitrary random logic, and requires adding significant test circuitry to the integrated circuit area. If BIST is not used and the test vectors are applied from an external ATE, it is desirable that the test vectors not only verify the integrated circuit operation but also the integrated circuit as it exists on a printed circuit board.

In the early 1990's, a standard was developed and approved as IEEE Std. 1149.1 and 1149.1a, henceforth referred to as the JTAG standard. The JTAG standard was envisioned to allow testing of the integrated circuit after it had been assembled onto the printed circuit board. Moreover, the JTAG standard provided for testing numerous integrated circuits on the board as well as the interconnect of those circuits to the printed conductors of the board. In-system testing was therefore provided for testing the entire, assembled printed circuit board using pins associated with a test access port ("TAP").

An integrated circuit that is JTAG compliant will have reserved a four or five signal TAP. If testing of the integrated circuit involves a boundary scan mechanism, then each integrated circuit also contains one or more boundary scan cells and a TAP controller for orchestrating signal flow within and through each of those cells.

FIG. 1 illustrates a printed circuit board 10 having multiple integrated circuits 12, 14, and 16 mounted thereon. For sake of brevity, only three integrated circuits are shown. However, it is recognized that a printed circuit board may embody certainly more than three integrated circuits. FIG. 1 also illustrates three input conductors 18 and three output conductors 20 associated with integrated circuit 14. Almost all integrated circuits are known to include more than three input conductors (or pins), and more than three output conductors (or pins). Therefore, FIG. 1 is used only as an abbreviated example so as not to unduly complicate the drawing.

Coupled between the input pins and the to-be-tested core logic 22 are respective boundary scan cells 24. Likewise boundary scan cells 26 are shown between core logic 22 and the output pins. Depending on the state of TAP controller 28, each boundary scan cell can either allow core logic 22 to be connected to external integrated circuits 12 and/or 16, or can enable boundary scan testing from a test data input conductor, TDI. TDI along with the test data output conductor TDO, the test mode select conductor TMS, and the test clock conductor TCK form four of possibly five pins attributed to TAP. TDI and TDO are daisy-chained through each boundary scan cell 24 and 26, and from integrated circuit to integrated circuit, whereas TCK and TMS are broadcast. Prior to entering the first of the daisy-chained integrated circuits, signals upon TDI, TDO, TMS, and TCK of the TAP are derived from an ATE.

In addition to boundary scan cells 24 and 26 attributed to each input/output pin, integrated circuit 14 also may include scan elements (SEs) 25 arranged internal to the circuit 14. Scan elements 25 are chained together and used for internal manufacturing testing of the core logic, for example. Scan elements 25 communicate with corresponding portions of the core logic 22. Each scan element may receive a bit, and shift that bit to the next scan element in the chain such that when the scan is complete, a multiple number of scan elements contain a rather large test vector comprising a plurality of bits. Thus, the scan elements may be rather numerous and may include more than one chain to facilitate design debug and manufacturing testing. Scan elements 25 are serially accessible from the TDI, TDO, TMS and TCK signals. The IEEE Std 1149.1 specification provides for multiple scan chains, some of which may be known to the integrated circuit manufacturer only. An example by which the scan elements 25 are used arise in programmable logic devices, and are expressed in various data sheets of manufacturers such as Cypress Semiconductor Corp.

Depending on what is placed into a scan chain, its length can be quite large. Shifting test information into or out of a rather long scan register chain can demand a lot of input and output cycles and associated vector memory on the ATE channels assigned to access the TAP pins of the integrated circuit under test. The IEEE Std 1149.1 makes known the use of bypass registers, or identification code (IDCODE) registers on dedicated chains within possibly numerous scan element chains that extend throughout an integrated circuit. While the boundary scan cells 24 and 26 can be parallel accessible through input/output pins, the internal scan elements 25 can only be accessed through the serial chain. Thus, the boundary scan cells may be deemed a specific implementation of the scan technique to test any core logic whatsoever, and scan elements are specific to the core logic across which they are chained together in serial fashion.

FIG. 2 illustrates in more detail the daisy-chaining of multiple integrated circuits 30 that are solder connected to surface-mount pads or vias of a printed circuit board 10. Depending on the number of integrated circuits having a TAP access, a single serialized test signal stream can be input throughout boundary scan cells 32a and 32b of each integrated circuit and thereafter placed in parallel within the core logic 34 of those integrated circuits. The test vectors are thereby said to be serially fed and parallel placed (i.e., scanned) into the functional core logic. Conversely, the test vectors can only be sent in series into the scan elements via TDI, and received from the scan elements in series via TDO. The ATE connected to TDI and TDO thereby not only produces the test vectors for testing the assembled printed circuit board, but also reads the test vector results. Details of the JTAG and TAP architecture are provided in the 1149.1 and 1149.1a specification. Further details of boundary scan systems and test vectors forward from an ATE to and from boundary scan cells are provided in U.S. Pat. Nos. 5,751,163 and 5,805,607 (both of which are herein incorporated by reference). It is noted that when describing the serial placement of test vectors into the boundary scan cells, serial placement of test vectors occurs within the internal scan elements—the only difference being that the scan chain of the scan elements can in some instances be much longer than, and have more scan elements than, the boundary scan cells.

While the provisions of JTAG and generally the concept of serially feeding test data into a single input pin and reading those results from a single output pin has many advantages, it also presents numerous disadvantages. For example, applying serially fed test vectors from an ATE to a TDI pin requires a significant amount of test time. In order to apply all the necessary test vectors to a relatively large logic portion, the serially fed test vectors must be quite lengthy. Each test vector must be serially scanned from one boundary scan cell to the next and, of greater criticality, from one scan element to the next within a rather large scan chain. The serially fed test vector proceeds from one scan cell or scan element until it reaches the appropriate "input" scan cell (or scan element) in the chain where it can then be applied to the core logic. Thereafter, an "output" scan cell (or scan element) will receive the test result of that test vector where output shifting is further necessary to present the result as a serially fed output signal on the TDO conductor. Serially feeding test vectors and serially reading those test results is not only time consumptive, but also is limiting as to the type of ATE that can be used. Specifically, the ATE is limited to one which can serially feed rather large numbers of test vectors and serially read those test results on a small number of pins.

It would desirable to utilize any conventional ATE, and not simply those designed to forward serialized test vectors and read serialized test results. Conventional testers which forward test vectors in parallel and receive test results in parallel would advantageously speed up the overall test process while maximizing the available vector memory applied to the integrated circuit via multiple tester pins. The desired parallel-delivered and parallel-received test mechanism should beneficially operate within the constraints of the JTAG compliant integrated circuit and JTAG printed circuit board architecture by only slightly modifying the boundary scan circuitry of that architecture. The improved test architecture, circuitry, and method could therefore have broader applications to highly complex integrated circuit testing while using a relatively small parallel-delivered test vector table employed in many conventional, multiple-pin testers.

SUMMARY OF THE INVENTION

The problems outlined above are in large part solved by an architecture which can apply test vectors in parallel to one or more integrated circuits arranged on and connected to a printed circuit board. The integrated circuit can therefore be tested by accessing at least some, if not all, boundary scan cells and internal scan elements arranged within one or more scan chains. The scan chains of the integrated circuit are tested either before or after assembly on or apart from a printed circuit board by any tester which can deliver test vectors and/or receive test results across numerous pins or conductors. Parallel delivery and receipt of test vectors and test results to and from the boundary scan cells provides for ease by which the test vectors can be placed upon the scan elements arranged in one or more chains internal to the core logic. Parallel delivery and receipt greatly enhances the overall test time and minimizes the test vector memory access times of the ATE. Additionally, depending on the test mode used, test vectors can be placed from a parallel-fed ATE or a serial-fed ATE.

Parallel delivery and receipt of test information preferably occurs to any and all scanable storage elements configured upon the integrated circuit. The delivery mechanism may, if desired, advantageously use the JTAG and/or boundary scan architecture of the integrated circuit and/or board. Preferably, the parallel delivered test vectors are forwarded onto the input pins of the integrated circuit, captured by the boundary scan cells, and shifted between boundary scan cells to present a test signal having serialized test vectors. The serial test vectors can then be sent to the scan elements on the appropriate scan chain inside the core logic and/or integrated circuit When the proper number of vectors have been shifted to the appropriate elements, an update latch within each scan element may be used to present its corresponding vector to a conductor extending from the scan element to the core logic circuitry. After the core logic has been tested, the test result is output and selected for transmission into a series of capture latches arranged near the output conductors of the core logic. The capture latches of the output scan elements perform similar to the capture latches of the input scan elements in that the capture latches will serialize the test results through a series of shift operations.

Included within the integrated circuit is a parallel/serial multiplexer that is responsive to whether the test vectors were sent from the ATE in parallel or serial fashion. In other words, the multiplexers determine whether the scan elements will receive parallel-driven test vectors via the boundary scan cells or will receive serial-driven test vectors. If presented serially, then the ATE would be connected to the TDI pin of the TAP. Otherwise, the ATE is connected to multiple pins of the integrated circuit that may or may not be connected to the printed circuit board. Application of the parallel-driven ATE to the multiple pins can occur through a bed-of-nails type test apparatus, for example. Another parallel/serial multiplexer may be used at or near the output pins of the integrated circuit and is configured based on whether the test results will be forwarded from the integrated circuit in parallel or in serial fashion. Thus, each integrated circuit preferably includes a pair of parallel/serial multiplexers. Depending on how those multiplexers are configured, either a serial test mechanism or a parallel test mechanism can be used, with selectivity therebetween.

According to one embodiment, test architecture is provided. The architecture includes an integrated circuit having a logic portion (i.e., core logic), and a plurality of input pins adapted to receive a parallel delivered test signal. A plurality of capture latches may be configured to receive the test signal in serial fashion and to deliver the test signal to a plurality of update latches. Conductors within the core logic portion are coupled to receive the test signal in parallel fashion from each of the plurality of update latches. The capture latches and update latches are thereby associated with any scanable device linked together in serial fashion, including the boundary scan cells or the scan elements.

The logic portion can also deliver test results to a plurality of capture latches, whereby those latches are clocked so as to serialize the test results for serial read out through the TDO pin. Alternatively, the test results can be delivered, either directly or from the TDO through serial-to-parallel conversion, upon a plurality of output pins of the integrated circuit.

A test access port (TAP) controller is also provided. The controller includes a first control signal generator, a first clock signal generator, and a second control signal generator. Each of the generators are operably coupled to boundary scan cells and scan elements of an associated integrated circuit. The first control signal generator is adapted to capture a parallel delivered test signal and the first clock signal generator is adapted to shift the captured test signal onto a single conductor as a serial test signal. The second control signal generator can then disburse in parallel format the test information from the serial test signal onto separate conductors. The separate conductors are those which extend into the core logic (if the controller is controlling input boundary scan cells), or the separate conductors are output pins if the controller is used to control output boundary scan cells.

A method is also provided for testing an integrated circuit or circuit board containing multiple integrated circuits. The method includes applying a test signal to a plurality of input pins of an integrated circuit. The test signal may then be shifted upon a single conductor, whereupon a plurality of test signals are drawn from the single conductor and forwarded to combinatorial and sequential logic preferably within the core logic portion of the integrated circuit. The test signal applied to the plurality of input pins can be selected rather than a test signal applied to a TAP serial input conductor of the integrated circuit. Test results of the test signal upon the core logic may then be forwarded to a plurality of output pins, or to a single TAP serial output conductor of the integrated circuit. Parallel-driven test vectors from the ATE can be written into any scanable device (i.e., scan cell or scan element), and test results can be drawn from the scanable devices in parallel via the output pins of the integrated circuit. The scanable device may or may not have direct access to the integrated circuit input/output pins depending on whether the scanable devices are scan cells external to the core logic or scan elements internal to the core logic. Parallel-placement of the test vectors occur using primarily the already available boundary scan elements on a boundary scan portion of the integrated circuit.

BRIEF DESCRIPTION OF THE DRAWINGS

Other objects and advantages of the invention will become apparent upon reading the following detailed description and upon reference to the accompanying drawings in which.

Figure 1:
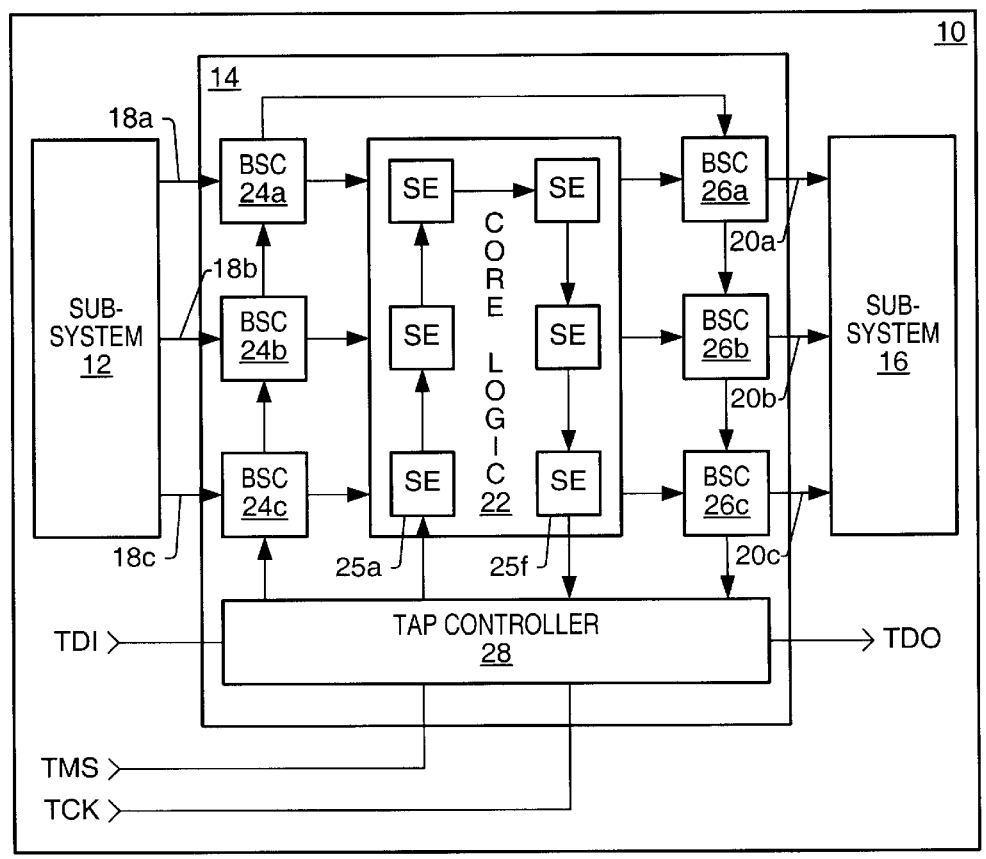
FIG. 1 is a block diagram of boundary scan cells arranged upon an integrated circuit between core logic and input/output pins, scan elements arranged within the core logic, and a TAP controller which orchestrates serialized test vectors placed into the boundary scan cells and the scan elements.
Figure 2:
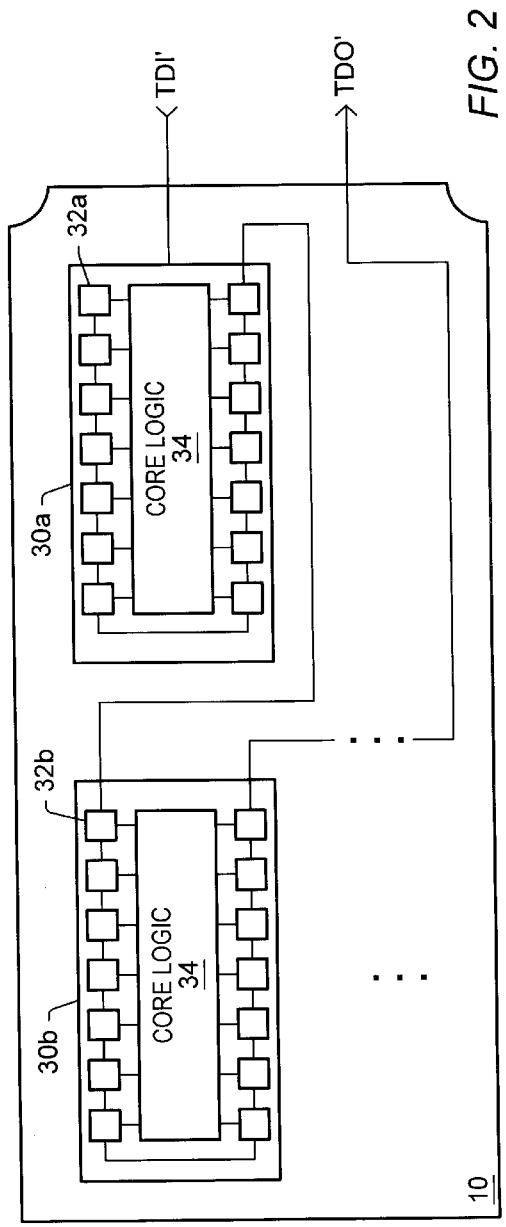
FIG. 2 is a block diagram of a printed circuit board having interconnected integrated circuits, and serialized test signal flow between boundary scan cells on separate integrated circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
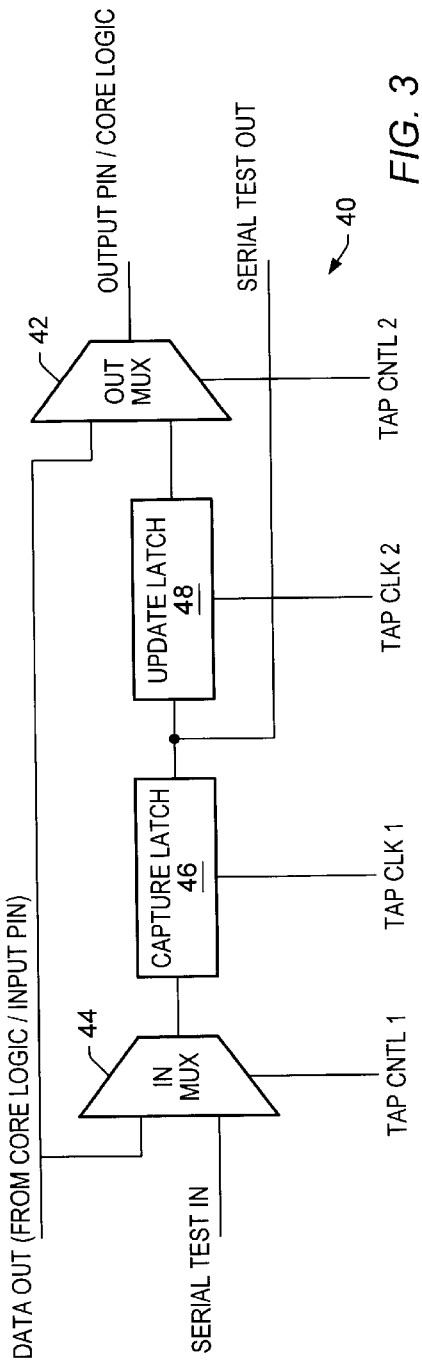
FIG. 3 is a circuit schematic of a boundary scan cell or a scan element, and the signals which control data and test signal flow therein according to one embodiment.

Turning now to the drawings, FIG. 3 illustrates a boundary scan cell or scan element, hereinafter scan device 40, that is configured to operate as an intermediary between the core logic of an integrated circuit and an output pin (or input pins) of the integrated circuit. Depending on how output multiplexer 42 is configured, scan device 40 can be arranged either as an input scan device or as an output scan device. The example shows the device as an output scan device, but it is recognized that it could equally perform as an input scan device using the same configuration. In the example shown, device 40 receives data from the core logic, shown as DATA OUT. Also, the device receives serialized test data from the previous device, shown as SERIAL TEST IN. Depending on whether the integrated circuit is in the test mode or in normal operation mode, either the SERIAL TEST IN signal or the DATA OUT signal will be selected by a tap control signal (TAP CNTL 1) forwarded to input multiplexer 44. Output multiplexer 42 will determine whether the DATA OUT signal will be transferred to the output pin, or whether the captured and updated test vector will be forwarded to the output pin of the integrated circuit if the scan device is a boundary scan cell.

The output of input multiplexer 44 forms the input of a capture latch 46 and the output of capture latch 46 forms the input of an update latch 48. Latches 46 and 48 are respectively clocked by clocking signals (TAP CLK 1 and TAP CLK 2) sent from the TAP controller. In a normal functional operation, where test vectors are not applied to nor read from the integrated circuit, the TAP controller is inactive and the output multiplexer 42 will be controlled by TAP CNTL 2 signal such that the signal DATA OUT is connected directly to the output pin of the integrated circuit to transfer the inner core logic test results to the output pin. During normal functional operation, control of the input multiplexer 44 is unimportant and the clock signals TAP CLK 1 and TAP CLK 2 are preferably inhibited.

When vector testing is to be performed, the TAP controller upon the integrated circuit controls TAP CNTL 2 such that output multiplexer 42 connects the output of output latch 48 to its output. TAP CNTL 1 signal is controlled such that the SERIAL TEST IN signal is forwarded to the output of input multiplexer 44, so that when the TAP controller serially outputs a sequence of test vectors, those vectors will be presented to capture latch 46 in serial fashion. After a plurality of clock cycles, dependent on the number and type of pin connections used, the TAP CLK 1 signal will forward the series of test vectors upon the output of capture latch 46. Each vector may be a single bit or, depending on the number of cycles used, can encompass a field of bits.

After the requisite number of vectors have been captured and serially fed to the next and succeeding scan device capture latch, a test vector is therefore said to be present at the output of each cell's capture latch. Thereafter, the TAP controller will then transition TAP CLK 2 signal such that the test bit on each capture latch output will appear on the output of each respective update latch 48. If the scan device is a boundary scan cell coupled to an output pin, the update latch output will thereafter appear on the output pin of that integrated circuit. If the scan device is a boundary scan cell coupled to an input pin, then the updated test vectors will be presented to corresponding input conductors of the core logic. If the integrated circuit output pads are connected to similar boundary scan cells configured as input boundary scan cells, then the TAP controllers controlling those input boundary scan cells can serially link their respective boundary scan cells so that a check can be carried out to ensure that the value written to the boundary scan cell by a particular TAP controller was successfully communicated to another boundary scan cell to which it is connected. In this manner, the interconnections between various integrated circuits can be tested.

Figure 4:
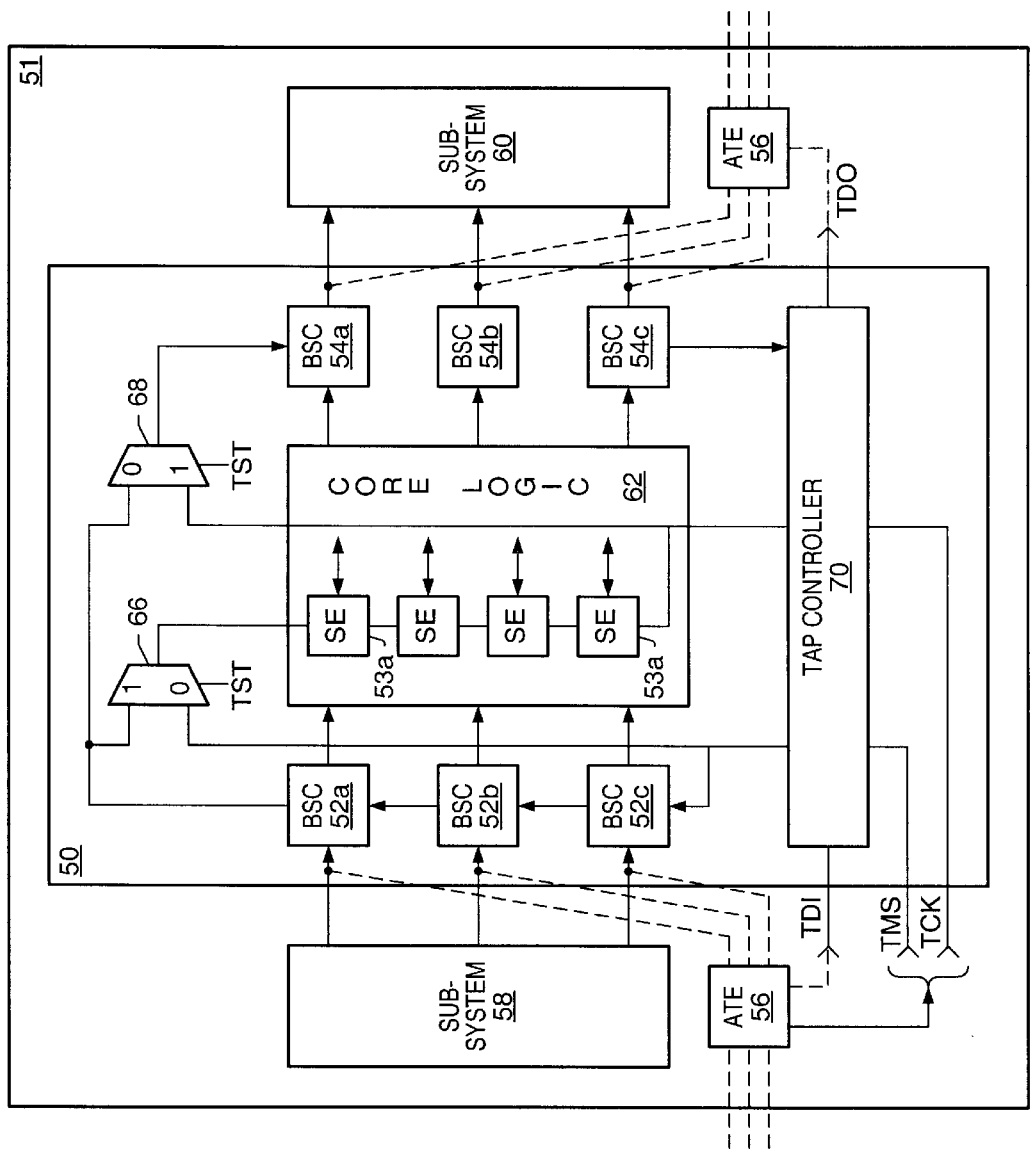
FIG. 4 is a block diagram of the test signals selectively applied either in parallel to the input/output pins or in series to the boundary scan cells and scan elements through the TAP according to separate embodiments.

FIG. 4 illustrates test architecture, circuitry, and methodology for selecting between parallel delivered and received test information or serial delivered and received test information. More specifically, FIG. 4 illustrates, in block diagram form, an integrated circuit 50 mechanically and electrically connected to printed circuit board 51. Integrated circuit 50 includes many input, output, and input/output pins. For sake of simplicity and brevity in the drawings, only three input pins and three output pins are shown. Each input pin is electrically connected to an input boundary scan cell 52 and each output pin is electrically connected to an output boundary scan cell 54. An ATE 56 can deliver and receive either parallel test information or serial test information. If used to deliver and receive serial test information, then the test vectors will be delivered serially to the TAP and the serial test results are received by TDO, as shown. Alternatively, however, the same ATE or a different ATE 56 can deliver and receive test information across a plurality of input and output pins. ATE can deliver and receive across N number of pins depending upon the amount of test vectors needed and the available size of ATE memory. In the example shown, ATE 56 can deliver to and receive from three respective pins. However, it is to be understood that more than three pins can be used to deliver and receive test information. Regardless of the number used, ATE 56 can deliver and receive the test information at the corresponding pins while the pins are soldered and otherwise electrically connected to various other integrated circuits 58 and 60. Thus, the test architecture is an in-system test architecture used to not only test core logic 62 within integrated circuit 50, but also the interconnections between integrated circuited and the printed conductors extending across PCB 51.

Each output boundary scan cell 54 has input and output multiplexers as wells as capture and update latches, similar to that shown in FIG. 3 with possibly a slight modification thereto. More specifically, the output multiplexer 42 may be reversed with an input pad of the integrated circuit and the update latch output connected to the input of multiplexer 42, and the output of multiplexer 42 connected as DATA IN to an input conductor of the core logic portion. Thus, the input boundary scan cells are configured similar to the output boundary scan cells, in that each have an input multiplexer, an output multiplexer, a capture latch, and an update latch.

Referring again to FIG. 4, a test (TST) signal may be forwarded from the ATE 56 to determine whether the test information will be provided as parallel information or as serial information. For example, the test signal can default to a serial test information selection unless activated. When activated, however, the TDI of the TAP will be disregarded and preferably inhibited. Instead, all test information will be derived from and sent to ATE 56 through a set of pins coupled to respective input/output pins on the integrated circuit. In the input example, the pins are input pins which receive parallel delivered test vectors across multiple pins (three in the example shown). The test vectors may then be placed into corresponding input boundary scan cells which can shift each bit or field of bits of the corresponding cell into the subsequent cell and so forth to present a serial output of cells. The serialized test vectors can then be fed to the parallel/serial multiplexer 66. If the test signal remains active to multiplexer 66, the serial information from the boundary scan cells 52 can be shifted into the scan elements 53. Scan elements 53 are eventually populated with respective test vectors and upon activation of each update latch, the corresponding test vectors are forwarded into conductors of core logic 62.

Multiplexers 66 and 68 exists to provide selectibility. If they did not exist in a conventional sense, then input from the TAP controller 70 would feed directly to scan elements 53. Likewise, the output from the last daisy-chained scan element 53 would be fed to the TAP controller 70, absent the selectibility of multiplexer 68. Also, absent multiplexers 66 and 68, output from input boundary scan cells 52 feed directly to output boundary scan cells 54. However, by using multiplexers 66 and 68, the test vectors can be placed in parallel on the boundary scan cells 52 and, through multiplexer 66, read the parallel-fed input test vectors into scan elements 53. Similarly, the serial output from scan elements 53 are made available to at least a subset of the boundary scan cells (e.g., output boundary scan cells) 54 via multiplexer 68 when test signal (TST) is a logic one value. Thus, when TST is a logic one, the output from boundary scan cells 52 is made available to the scan elements 53 (via multiplexer 66), and the output from scan elements 53 are made available to boundary scan cells 54.

The scan elements 53 are arranged similar to the boundary scan cells 52 and 54, in that each scan element contains corresponding input/output multiplexers, capture latches and update latches such as those shown in FIG. 3. Data from the output multiplexer 42 is either sent to the core logic from the boundary scan cells or from the scan elements, depending on whether the scan device 40 is a boundary scan cell or a scan element. Alternatively, data from the output multiplexer 42 can be sent to the output pins if the scan device 40 is a boundary scan cell 54. Thus, the scan device 40 can be thought of as either an input boundary scan cell 52, an output boundary scan cell 54, or a scan element 53. Each bit or field of bits captured in parallel by the input boundary scan cell or output boundary scan cell is maintained within corresponding capture latches, and the bit or field of bits serially fed into the scan element 53 is captured by corresponding capture latches before being fed in parallel by the update latches.

Cells 52 receive in parallel, and elements 53 as well as cells 54 deliver in parallel. The test vectors are shifted into the scan elements 53 and delivered onto corresponding conductors of the core logic in parallel. Test results are either shifted in series upon a single conductor to TDO, or are forwarded to the output pins directly or, alternatively, converted from serial form to parallel form before being placed on the output pins. The status of test signal TST determines whether output multiplexer 68 will forward the serialized information from the input boundary scan cells 52 or the scan elements 53. If the test signal is active, then test results fed into the scan elements 53 are forwarded through the boundary scan cells 54, where they can be delivered in parallel from the output pins of the integrated circuit 50. It is noted that FIG. 4 illustrates only a single, serial chain of scan elements 53 only for sake of brevity and clarity in the drawings. Numerous scan elements 53 can be linked upon dissimilar chains, each of which is selectibly routed to output multiplexer 68.

Figure 5:
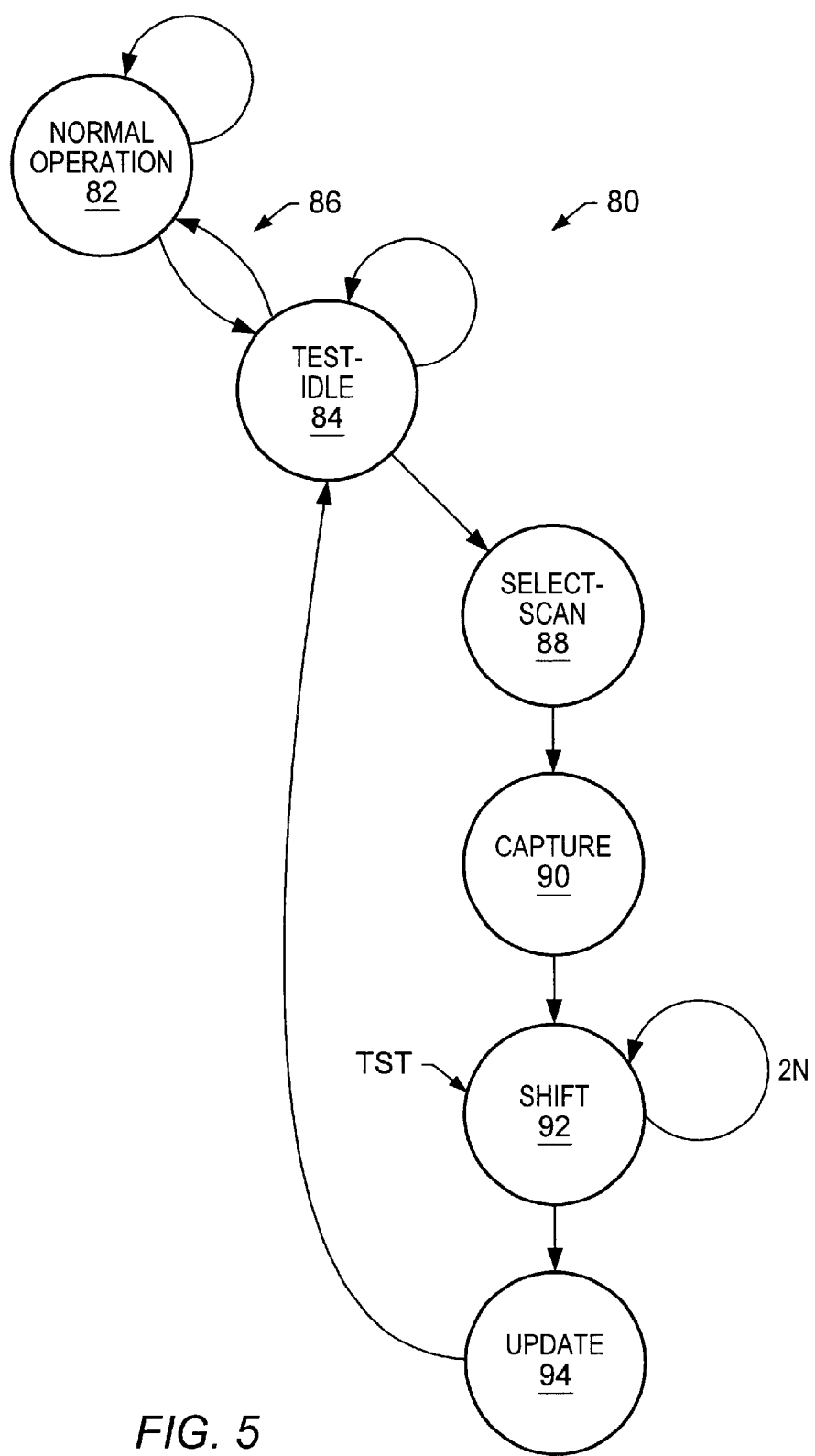
FIG. 5 is a partial state diagram for the TAP controller in FIG. 4 for carrying out a parallel or serial test access of the core logic.

It will be appreciated upon reviewing FIG. 4, in combination with FIG. 5, that TAP controller 70 comprises a state machine which produces various signals at select times. Those signals are control and clocking signals that are broadcast delivered to either input cells 52, elements 53 and/or output cells 54, depending on whether test vectors are being delivered or test results are being received (either from an external cell or an internal element). Accordingly, control lines are present between TAP controller 70 and the various cells. The control lines are used to orchestrate the control and clocking signals sent to the input and output multiplexers (shown in FIG. 4), as well as the capture and update latches (shown in FIG. 3).

A partial state diagram 80 is shown in FIG. 5. The state diagram illustrates six of possibly numerous control states of TAP controller 70, shown in FIG. 4. Referring to FIGS. 4 and 5 in combination, TAP controller 70 forwards various control signals to the respective scan devices 52, 53 or 54 depending on the state of its state machine.

During normal functional operation of integrated circuit 50, TAP controller 70 is in state 82. In this state, the data on the input conductor of input scan device (DATA IN) is connected to DATA OUT sent into the core logic. More specifically, in a normal functional operation, whatever is input to the input pad will be forwarded into core logic, and whatever is output from the core logic will be forwarded to the output pad. Connection of DATA IN and DATA OUT is effectuated through control of TAP CNTL 2 signal. The TAP CNTL 2 signal as well as TAP CNTL 1, TAP CLK 1, and TAP CLK 2, are derived from a master clock signal which is a buffered version of the TCK signal defined in the JTAG standard. Upon commencement of a test operation, TAP controller 70 will first transition to test-idle state 84. Transitions 86 occur between states 82 and 84 depending on whether normal operation or test operation occurs. However, once in an appropriate state, TAP controller 70 will remain in that state unless a transition 86 occurs. If a scan test is to be carried out, the TAP controller 70 will, on the next cycle of the master clock, enter selective-scan state 88. On the next clock cycle of the master clock, TAP controller 70 will enter a capture state 90. When in state 90, TAP CNTL 1 signal will be such that the input pin will be connected directly to the input of the capture latch 46. On the next transition of the master clock, a shift state 92 occurs. In this state TAP controller 70 produces a plurality of clock cycles, such as TAP CLK 1 while maintaining TAP CNTL 1 at a level such that the SERIAL TEST IN signal appears at the input of capture latch 46. Each transition of TAP CLK 1 will serially shift the captured ATE test data into the test next scan device. The number of shifts N is dependent upon the number of input (or output) boundary scan cells and/or the number of scan elements within the internal scan chain. Thus, the number of clock cycles necessary to shift the test vectors from cells 52 into the core logic (or into the scan elements 53) and from the core logic to scan elements 53 (or boundary cells 54) is represented as 2N+2M, where N represents the number of boundary scan cells and M represents the number of scan elements. Hence, for 2N+2M cycles of the master clock, shift state 92 is maintained. On the next cycle of the master clock or sometime thereafter, an update state 94 is entered. While in the update state 94, TAP controller 70 will cause the output of update latch 48 to be updated by generating a clock cycle of TAP CLK 2. The test vector data bit or field of bits, on the input of update latch 48 will therefore appear on the output of latch 48, and consequently to the output pin as DATA OUT, or to the core logic as DATA IN. In the input boundary scan example, all of the DATA IN signals will have been updated and thereafter sent into integrated circuit 14, as well as various integrated circuits serially connected thereto.

Test data for internal scan elements are captured on N inputs, then shifted out N cycles. This process is repeated until all of the M scan elements are loaded in M/N capture operations. In the absence of the advantages described herein, it would have taken M shifts through the TDI with unique data, or M vectors. When ATE data is captured in parallel and shifted serially, the extra clock cycles necessary to complete the shift usually does not introduce additional test vectors because after data is captured in parallel, it does not matter what data appears at the parallel inputs while the shift operation is in progress.

Once the test vectors are input into the core logic via the update state 94, state machine will transition to state 84 and remain in state 84 until the output boundary scan cells receive the test results. Then the test results are captured by transitioning TAP CLK 1 while the input multiplexer 44 is controlled through TAP CNTL 1 such that the signal of the DATA OUT line appears on the output of input multiplexer 44. Capture latch 46 will capture the test result during state 90. On the next master clock cycle, shift state 92 is entered and, once again, the results captured on the output of capture latch 46 are serially clocked out of the TAP controller under the control of TAP CLK 1 as SERIAL TEST OUT signal. The capture result is clocked out of the capture latch and a new set of test bits can be clocked into corresponding latches. The update state 94 can then be used to forward the capture test result data bit or field to an update latch and thereafter to an output pin of the integrated circuit, whereupon ATE 56 receives the test result in parallel with other output pin test results. The above described sequence of states is repeated continuously for all scan devices that are serially linked between the parallel-fed input pins and the parallel-delivered output pins.

It will be appreciated to those skilled in the art having the benefit of this disclosure that the embodiments described are believed applicable to testing either in parallel or serial fashion one or more integrated circuits which may be mechanically and electrically connected to a printed circuit board. The ATE can either be one which delivers and receives test information in parallel or serial fashion and, therefore, selectivity between the various test modes is achieved by forwarding a test mode signal to parallel/serial multiplexers configured upon one or more integrated circuits. The various architectures, circuitry, and methodologies used to produce these advantages are set forth in the claims. Accordingly, the specification and drawings are to be regarded in an illustrative rather than a restrictive sense as to possibly numerous architectures, circuitry, and methodologies which fall within the spirit and scope of the present invention.

What is claimed is:

1. Test architecture, comprising:
    an integrated circuit having a plurality of input pins adapted to receive a parallel delivered test signal;

a singular input pin adapted to receive a serial delivered test signal; and a first multiplexer coupled to directly present to a plurality of scan elements within a core logic of the integrated circuit either the serial delivered test signal or the parallel delivered test signal converted to serial format.

2. The test architecture as recited in claim 1, further comprising a plurality of serially linked input boundary scan cells coupled to respective said plurality of input pins.

3. The test architecture as recited in claim 2, further comprising:

a plurality of output pins; and a second multiplexer coupled to the input boundary scan cells and the scan elements to selectively present either an output from the input boundary scan cells or an output from the scan elements in parallel to the plurality of output pins.

4. Test architecture, comprising:

an integrated circuit having a logic portion and a plurality of input pins adapted to receive a parallel delivered test signal;

a plurality of boundary scan cells adapted to convert the parallel delivered test signal into a serial test signal; and a plurality of scan elements adapted to receive the serial test signal, wherein the scan elements comprise a plurality of capture latches configured to deliver the serial test signal to a plurality of update latches before sending the serial test signal in parallel fashion to circuitry within the logic portion.

5. The test architecture as recited in claim 4, wherein an input of one of the plurality of update latches is connected to an output of one of the plurality of capture latches, each of which are clocked at dissimilar times.

6. The test architecture as recited in claim 4, wherein the serial test signal is shifted through the plurality of capture latches by using a clocking signal which transitions a number of times proportional to the number of said plurality of capture latches.

7. The test architecture as recited in claim 4, wherein the serial test signal is forwarded across a single conductor that is routed between the plurality of capture latches.

8. The test architecture as recited in claim 7, wherein the single conductor is routed from the integrated circuit to another integrated circuit, both of which are interconnected upon a printed circuit board.

9. The test architecture as recited in claim 4, wherein the logic portion comprises sequential and/or combinatorial logic.

10. The test architecture as recited in claim 4, wherein the plurality of boundary scan cells comprises a second plurality of capture latches and update latches, and wherein the plurality of boundary scan cells are interconnected between respective said plurality of input pins and the plurality of scan elements.

11. A semiconductor substrate, comprising:

a plurality of input pins adapted to receive a parallel delivered test signal;

a single input pin adapted to receive a serial delivered test signal;

a first multiplexer adapted to directly present either the parallel delivered test signal converted to serial format or the serial delivered test signal to a plurality of scan elements within a core logic of an integrated circuit; and a test access port (TAP) controller coupled between the single input pin and the first multiplexer, wherein the TAP controller comprises:

a first control signal generator adapted to capture a test signal, wherein the test signal comprises either the parallel delivered test signal converted to serial format or the serial delivered test signal;

a first clock signal generator adapted to serially shift the test signal across the plurality of scan elements; and a second control signal generator adapted to dispense, in parallel, portions of the test signal from the plurality of scan elements onto separate conductors coupled to circuitry within the core logic.

12. The semiconductor substrate as recited in claim 11, wherein the portions comprise test data.

13. The semiconductor substrate as recited in claim 11, wherein the portions comprise at least one bit of test data.

14. The semiconductor substrate as recited in claim 11, wherein the first control generator is configured to produce a first control signal, said first clock signal generator is configured to produce a first clock signal, and said second control signal generator is adapted to produce a second control signal.

15. The semiconductor substrate as recited in claim 14, wherein the first control signal is produced prior to the first clock signal, and the first clock signal is produced prior to the second control signal.

16. The semiconductor substrate as recited in claim 11, wherein each of the plurality of scan elements comprises an input latch coupled to receive output from the first multiplexer and produce output to a second multiplexer.

17. A method for testing an integrated circuit, comprising:

applying a test signal to a plurality of input pins of an integrated circuit;

shifting the test signal onto a single conductor; and drawing from the single conductor portions of the test signal to be forwarded in parallel to combinatorial and sequential logic within the integrated circuit.

18. The method as recited in claim 17, wherein said applying comprises coupling a multi-output test signal generator to the input pins.

19. The method as recited in claim 17, further comprising selecting the test signal applied to the plurality of input pins rather than another test signal applied to a test access port (TAP) serial input conductor of the integrated circuit.

20. The method as recited in claim 17, further comprising capturing the test signal within a plurality of capture latches prior to shifting the test signal upon the single conductor.

21. The method as recited in claim 17, further comprising forwarding results of the test signal upon the combinatorial and sequential logic to a plurality of output pins of the integrated circuit or a single test access port (TAP) serial output conductor of the integrated circuit.

22. The method as recited in claim 17, wherein said shifting comprises clocking the test signal across a plurality of scan devices by clocking a plurality of capture latches coupled to receive the test signal.

23. The method as recited in claim 22, wherein said scan devices comprise either boundary scan cells or scan elements.

* * * * *